(12) United States Patent
Miyoshi (10) Patent No.: US 7,514,925 B2
(45) Date of Patent: Apr. 7, 2009

(54) MAGNETIC RESONANCE IMAGING APPARATUS AND MAGNETIC RESONANCE IMAGING METHOD

(75) Inventor: Mitsuharu Miyoshi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/866,805

(22) Filed: Oct. 3, 2007

(65) Prior Publication Data
US 2008/0084206 A1    Apr. 10, 2008

(30) Foreign Application Priority Data
Oct. 6, 2006  (JP)  .............................. 2006-275385

(51) Int. Cl.
*G01V 3/00* (2006.01)
(52) U.S. Cl. ........................................ 324/309; 324/307
(58) Field of Classification Search ......... 324/300–322; 600/407–445
See application file for complete search history.

(56) References Cited

U.S. PATENT DOCUMENTS

| | | | |
|---|---|---|---|
| 5,229,717 A | 7/1993 | Hinks | |
| 5,271,399 A | 12/1993 | Listerud et al. | |
| 5,280,244 A | 1/1994 | Hinks | |
| 5,378,985 A | 1/1995 | Hinks | |
| 6,008,647 A | 12/1999 | Zhou et al. | |
| 6,011,392 A | 1/2000 | Zhou et al. | |
| 6,025,714 A | 2/2000 | Avram et al. | |
| 6,043,654 A | 3/2000 | Liu et al. | |
| 6,078,176 A | 6/2000 | McKinnon | |
| 6,134,464 A | 10/2000 | Tan et al. | |
| 6,141,578 A * | 10/2000 | Hardy | ........................ 600/410 |
| 6,160,397 A | 12/2000 | Washburn et al. | |
| 6,265,873 B1 | 7/2001 | Le Roux | |
| 6,335,621 B1 | 1/2002 | Cho | |
| 6,369,568 B1 | 4/2002 | Ma et al. | |

(Continued)

FOREIGN PATENT DOCUMENTS

JP    6022919    2/1994

(Continued)

OTHER PUBLICATIONS

MR Angiography (MRA); Japanese Journal of Radiological Technology; Sep. 2003; vol. 59, No. 9; pp. 1112-1122.

*Primary Examiner*—Brij B Shrivastav
(74) *Attorney, Agent, or Firm*—Armstrong Teasdale LLP (57) ABSTRACT

With the objective of easily drawing a flow such as a bloodstream in a subject at low luminance, there is provided a magnetic resonance imaging apparatus including a static magnetic field forming unit, a transmission unit which transmits a plurality of inversion RF pulses to a subject lying in a static magnetic field plural times within one repetition time after transmission of one excitation RF pulse thereby to excite spins of the subject, a gradient magnetic field application unit, a data acquisition unit which acquires magnetic resonance signals encoded by the gradient magnetic field, and an image generation unit which generates an image of the subject based on the magnetic resonance signals acquired by the data acquisition unit. The gradient magnetic field application unit applies velocity encode gradient pulses inverted to one another in polarity to the subject within transmission interval times for the plural RF pulses transmitted to the subject.

20 Claims, 6 Drawing Sheets

U.S. PATENT DOCUMENTS

| | | | |
|---|---|---|---|
| 6,380,739 B1 * | 4/2002 | Machida | 324/309 |
| 6,487,435 B2 * | 11/2002 | Mistretta et al. | 600/420 |
| 6,782,286 B2 | 8/2004 | Miyazaki | |
| 6,803,763 B2 | 10/2004 | Peters et al. | |
| 6,847,209 B2 | 1/2005 | Shenoy et al. | |
| 7,034,532 B1 | 4/2006 | Shenoy | |
| 7,049,816 B2 * | 5/2006 | Mistretta et al. | 324/306 |
| 7,119,540 B1 | 10/2006 | Shenoy et al. | |
| 7,141,972 B2 | 11/2006 | Avram et al. | |
| 7,157,909 B1 | 1/2007 | Shenoy | |
| 7,242,190 B1 | 7/2007 | Shenoy | |
| 2007/0167733 A1 * | 7/2007 | Miyoshi | 600/410 |
| 2008/0136411 A1 * | 6/2008 | Miyoshi | 324/309 |
| 2008/0150530 A1 * | 6/2008 | Miyoshi | 324/309 |

FOREIGN PATENT DOCUMENTS

| | | |
|---|---|---|
| JP | 2000005144 | 1/2000 |
| JP | 2000-005144 | 11/2000 |
| JP | 2005-270304 | 6/2005 |

* cited by examiner

MAGNETIC RESONANCE IMAGING APPARATUS AND MAGNETIC RESONANCE IMAGING METHOD

CROSS REFERENCE TO RELATED APPLICATIONS

This application claims the benefit of Japanese Application No. 2006-275385 filed Oct. 6, 2006.

BACKGROUND OF THE INVENTION

The present invention relates to a magnetic resonance imaging (MRI) apparatus and a magnetic resonance imaging method. The present invention relates particularly to a magnetic resonance imaging apparatus and a magnetic resonance imaging method which carry out a fast spin echo (FSE) method.

An image diagnostic apparatus such as a magnetic resonance imaging system or apparatus has been known as an apparatus for imaging or photographing a slice image about each tomographic plane of a subject. The image diagnostic apparatus has been used in various fields such as a medical application, an industrial application, etc.

When, for example, a slice image is photographed using the magnetic resonance imaging apparatus, a subject is held or accommodated in a space formed with a static magnetic field and the directions of spins of proton in the subject corresponding to a living body are aligned in the direction of the static magnetic field, thereby bringing about a state in which magnetization vectors have been obtained.

Thereafter, an electromagnetic wave having a resonance frequency is applied to the subject through an RF coil to generate a nuclear magnetic resonance phenomenon, thereby changing the magnetization vector of proton of the subject. The magnetic resonance imaging apparatus receives a magnetic resonance signal from the proton of the subject returned to the original magnetization vector at a probe coil (reception coil unit) and generates a slice image, based on the received magnetic resonance signal (refer to, for example, a patent document 1).

Meanwhile, a flow such as a bloodstream exists in the subject, and there is a case in which the intensity of a magnetic resonance signal corresponding to a bloodstream or blood-flow signal is suppressed to draw the flow at low luminance at the magnetic resonance imaging apparatus. To this end, there is provided one in which as known as a Double IR (Inversion Recovery) method, signals other than at a target slice section are inverted using slice selection IR pulses at the target slice section after the inversion of signals in coil sensitivity using slice non-selection IR pulses, and magnetic resonance signals are acquired and the signals other than at the target slice section are brought into null-signal form.

As known as a Flow-spoiled FBI method, there is provided one in which in the FBI method (Fresh Blood Imaging) (refer to, for example, a patent document 2), spoiling pulses in a read-out direction are used to enable separation of blood-vessel arteries and veins.

[Patent Document 1] Japanese Unexamined Patent Publication No. 2005-270304

[Patent Document 2] Japanese Unexamined Patent Publication No. 2000-5144

In the Double IR method, the slice selection IR pulses are transmitted to a target slice section having a predetermined thickness. Therefore, when, for example, three-dimensional imaging is performed, it is difficult to make out or draw a bloodstream about a wide region of a predetermined thickness or more at low luminance.

Since the quantitativity of each spoiling pulse cannot be adjusted in the Flow-spoiled FBI method, a preparation scan is required before an actual scan when a delay time from the generation of a trigger pulse to the start of actual imaging or photography is optimized and the gradient of the spoiling pulse is adjusted.

The spoiling pulses are transmitted to a subject even upon acquisition of magnetic resonance signals at an actual scan. Therefore, the fast spin echo method involves a problem that when it is adopted, the interval (echo space) between pulses applied to obtain respective echoes is spread, thus resulting in an obstacle to fast imaging. Further, the FSE method was inadequate to deal with spoiling of magnetic resonance signals about the bloodstream by the spoiling pulses.

SUMMARY OF THE INVENTION

It is desirable that problems described previously are solved.

One aspect of the invention provides a magnetic resonance imaging apparatus comprising a static magnetic field forming unit which forms a static magnetic field in a space in which a subject is held, a transmission unit which transmits a plurality of inversion RF pulses to the subject lying in the static magnetic field plural times within one repetition time after transmission of one excitation RF pulse thereby to excite spins of the subject, a gradient magnetic field application unit which applies a gradient magnetic field to the subject and encodes magnetic resonance signals from the spins excited by the inversion RF pulses, a data acquisition unit which acquires the magnetic resonance signals encoded by the gradient magnetic field, and an image generation unit which generates an image of the subject, based on the magnetic resonance signals acquired by the data acquisition unit, wherein the gradient magnetic field application unit applies velocity encode gradient pulses inverted to one another in polarity to the subject within transmission interval times of the RF pulses transmitted to the subject.

Preferably, the gradient magnetic field application unit applies the velocity encode gradient pulses before the data acquisition unit acquires the magnetic resonance signals. More preferably, the gradient magnetic field application unit applies the velocity encode gradient pulses to the subject plural times with respect to the plurality of inversion RF pulses.

The velocity encode gradient pulses inverted to one another in polarity spoil transverse magnetization of spins about a flow in the subject.

Specifically, the flow in the subject is a bloodstream.

Preferably, the directions of the velocity encode gradient pulses inverted to one another in polarity are directions of at least one or more axes.

More preferably, the areas of the velocity encode gradient pulses inverted to one another in polarity differ every axis.

The gradient magnetic field application unit may have an operation unit for inputting the areas of the velocity encode gradient pulses applied to the subject.

Further, the image generation unit generates an image of the subject, based on the magnetic resonance signals acquired by the data acquisition unit in states in which the gradient magnetic field application unit applies the velocity encode gradient pulses inverted to one another in polarity to the subject and do not apply the same thereto.

Preferably, the gradient magnetic field application unit generates states of application and unapplication of the velocity encode gradient pulses inverted to one another in polarity according to pulsatility of the bloodstream.

Another aspect of the invention provides a magnetic resonance imaging method comprising the steps of transmitting a plurality of inversion RF pulses plural times to a subject lying in a static magnetic field within one repetition time after transmission of one excitation RF pulse, applying a gradient magnetic field to the subject and encoding magnetic resonance signals from spins excited by the RF pulses, acquiring the magnetic resonance signals each encoded by the gradient magnetic field, and generating an image of the subject based on the acquired magnetic resonance signals, the method further including the step of applying velocity encode gradient pulses inverted to one another in polarity to the subject within transmission interval times for the RF pulses transmitted to the subject.

Preferably, the step of applying the velocity encode gradient pulses inverted to one another in polarity to the subject is performed before the step of acquiring the magnetic resonance signals.

In the step of applying the velocity encode gradient pulses inverted to one another in polarity to the subject, transverse magnetization of spins about a flow in the subject is spoiled.

Preferably, in the step of applying the velocity encode gradient pulses inverted to one another in polarity to the subject, the directions of the velocity encode gradient pulses inverted to one another in polarity are defined as directions of at least one or more axes.

More preferably, the areas of the velocity encode gradient pulses inverted to one another in polarity differ every axis.

Preferably, in the step of applying the velocity encode gradient pulses inverted to one another in polarity to the subject, the area of the gradient magnetic field is adjusted according to the speed of the flow in the subject.

Further, a step of not applying the velocity encode gradient pulses inverted to one another in polarity to the subject before the step of acquiring the magnetic resonance signals is additionally included. In the subject' image generating step, an image of the subject is generated based on the magnetic resonance signals acquired in the magnetic resonance signal acquiring step after the step of applying the velocity encode gradient pulses inverted to one another in polarity to the subject and the step of not applying the velocity encode gradient pulses to the subject.

In the magnetic resonance imaging apparatus and the magnetic resonance imaging method according to the invention, the gradient magnetic field application unit applies the velocity encode gradient pulses inverted to one another in polarity to the subject before the data acquisition unit acquires the magnetic resonance signals, thereby spoiling the spins about the flow.

In the magnetic resonance imaging apparatus and the magnetic resonance imaging method according to the invention, a flow such a bloodstream in a subject can easily be drawn at low luminance and fast imaging is enabled because a fast spin echo method is adopted.

Further objects and advantages of the present invention will be apparent from the following description of the preferred embodiments of the invention as illustrated in the accompanying drawings.

DETAILED DESCRIPTION OF THE INVENTION

One embodiment according to the present invention will hereinafter be explained based on FIGS. 1 through 7.

(System Construction)

Figure 1:
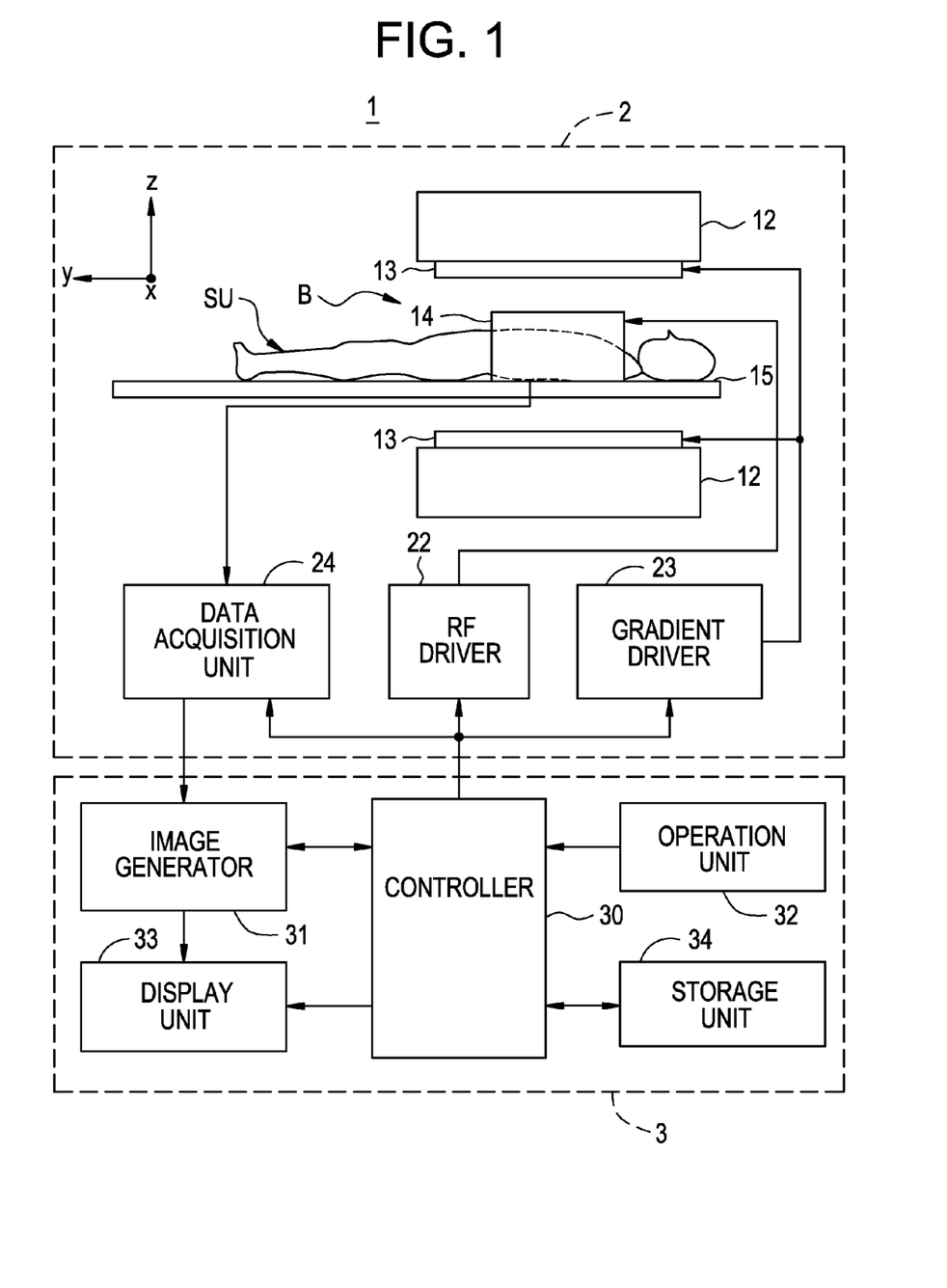
FIG. 1 is a diagram showing a construction of a magnetic resonance imaging apparatus according to an embodiment of the present invention.

FIG. 1 is a configurational diagram showing a construction of a magnetic resonance imaging apparatus 1 illustrative of the one embodiment according to the present invention.

As shown in FIG. 1, the magnetic resonance imaging apparatus 1 of the present embodiment has a scan section 2 and an operation console section 3.

The scan section 2 will be described.

As shown in FIG. 1, the scan section 2 has a static magnetic field magnet unit 12, a gradient coil unit 13, an RF coil unit or part 14, a cradle 15, an RF driver 22, a gradient driver 23 and a data acquisition unit 24. The scan section 2 executes an imaging sequence IS for transmitting an RF pulse to a subject SU so as to excite the spin of the subject SU in an imaging space B formed with a static magnetic field and transmitting a gradient pulse to the subject SU to which the RF pulse has been transmitted, thereby obtaining a magnetic resonance signal generated in the subject SU as imaging data.

Respective constituent elements of the scan section 2 will be explained sequentially.

The static magnetic field magnet unit 12 comprises, for example, a permanent magnet and forms a static magnetic field in the imaging space B in which the subject SU is accommodated or held. Here, the static magnetic field magnet unit 12 forms the static magnetic field in such a manner that the direction of the static magnetic field extends along the direction orthogonal to a body-axis direction of the subject SU. Incidentally, the static magnetic field magnet unit 12 may be constituted of a superconductive magnet.

The gradient coil unit 13 forms a gradient magnetic field in the imaging space B formed with the static magnetic field and applies or adds spatial position information to the magnetic resonance signal received by the RF coil part 14. Here, the gradient coil unit 13 comprises three systems set so as to correspond to three-axis directions of a z direction extending along a static magnetic field direction, an x direction and a y direction. These apply gradient pulses in a frequency encode direction, a phase encode direction and a slice selection direction respectively according to imaging conditions to thereby form gradient magnetic fields.

Described specifically, the gradient coil unit 13 applies the gradient magnetic field in the slice selection direction of the subject SU and selects a slice of the subject SU excited by transmission of the RF pulse by the RF coil part 14. The gradient coil unit 13 applies the gradient magnetic field in the phase encode direction of the subject SU and phase-encodes a magnetic resonance signal from the slice excited by the RF pulse. And the gradient coil unit 13 applies the gradient magnetic field in the frequency encode direction of the subject SU and frequency-encodes the magnetic resonance signal from the slice excited by the RF pulse.

The gradient coil unit 13 generates the gradient magnetic field for performing phase encoding. As will be described below in addition to the above, the gradient coil unit 13 also generates velocity encode gradient pulses inverted to each other in polarity and distributes transverse magnetization of spins of a flowing tissue in the subject SU. In order to distribute the transverse magnetization of the spins of the flowing tissue in the subject SU, the intensities of the velocity encode gradient pulses inverted to each other in polarity and the occurrence time thereof are set individually.

As shown in FIG. 1, the RF coil unit 14 is disposed so as to surround an imaging area of the subject SU. The RF coil unit 14 transmits the RF pulse corresponding to an electromagnetic wave to the subject SU within the imaging space B formed with the static magnetic field by the static magnetic field magnet unit 12 to form a high frequency magnetic field, thereby exciting the spins of proton in the imaging area of the subject SU. The RF coil unit 14 receives an electromagnetic wave generated from the excited proton in the subject SU as a magnetic resonance signal.

In order to execute an FSE (Fast Spin Echo) method as will be described below, the RF coil unit 14 transmits, within one repetition time TR, one excitation RF pulse for rotating a magnetic moment in a desired slice about a z axis by $\alpha$ ($\pi/2$, for example) with the direction of the static magnetic field as the axis (indicative of a rotating coordinate system rotated at a Larmor frequency) and a plurality of inversion RF pulses to the subject SU.

The cradle 15 has a base or table that places the subject SU thereon. The cradle 15 moves between the inside and outside of the imaging space B, based on a control signal supplied from a controller 30.

The RF driver 22 drives the RF coil unit 14 to transmit an RF pulse to within the imaging space B, thereby forming a high frequency magnetic field therein. The RF driver 22 modulates a signal sent from an RF oscillator to a signal having predetermined timing and predetermined envelope using a gate modulator on the basis of the control signal outputted from the controller 30. Thereafter, the RF driver 22 allows an RF power amplifier to amplify the signal modulated by the gate modulator and outputs the same to the RF coil unit 14, and allows the RF coil unit 14 to transmit the RF pulse.

The gradient driver 23 applies a gradient pulse to the gradient coil unit 13 based on the control signal outputted from the controller 30 to drive the gradient coil unit 13, thereby to generate a gradient magnetic field within the imaging space B formed with the static magnetic field. The gradient driver 23 has a three-system drive circuit (not shown) in association with the three-system gradient coil unit 13.

The data acquisition unit 24 acquires a magnetic resonance signal received by the RF coil unit 14 based on the control signal outputted from the controller 30. Here, the data acquisition unit 24 phase-detects the magnetic resonance signal received by the RF coil unit 14 using a phase detector with the output of the RF oscillator of the RF driver 22 as a reference signal. Thereafter, the data acquisition unit 24 converts the magnetic resonance signal corresponding to the analog signal into a digital signal by using an A/D converter and outputs it therefrom.

The operation console section 3 will be explained.

As shown in FIG. 1, the operation console section 3 has the controller 30, an image generator 31, an operation unit 32, a display or display unit 33 and a storage unit 34.

Respective constituent elements of the operation console section 3 will be described sequentially.

The controller 30 has a computer and programs that allow a computer to execute predetermined data processing, and controls respective parts. Here, the controller 30 inputs operation data sent from the operation unit 32 and outputs a control signal for allowing the RF driver 22, gradient driver 23 and data acquisition unit 24 to execute a predetermined scan to them, based on the operation data inputted from the operation unit 32, thereby performing their control. Along with it, the controller 30 outputs control signals to the image generator 31, display unit 33 and storage unit 34 to perform their control.

The image generator 31 has a computer and programs that execute predetermined data processing using the computer. The image generator 31 generates an image, based on the control signal outputted from the controller 30. The image generator 31 reconstructs the image about the subject SU with a magnetic resonance signal obtained by executing a scan by the scan section 2 as row data. Then, the image generator 31 outputs the generated image to the display 33.

The operation unit 32 is constituted of an operation device such as a keyboard, a pointing device or the like. The operation unit 32 inputs operation data from an operator and outputs the same to the controller 30.

The display unit 33 is constituted of a display device such as a CRT and displays an image on its display screen, based on the control signal outputted from the controller 30. For example, the display unit 33 displays images about input items corresponding to the operation data inputted to the operation unit 32 by the operator on the display screen in plural form. Further, the display unit 33 receives data about the image of the subject SU generated based on the magnetic resonance signal from the subject SU from the image generator 31 and displays the image on the display screen.

The storage unit 34 comprises a memory and stores various data therein. In the storage unit 34, the stored data are accessed by the controller 30 as needed.

(Operation)

Figure 2:
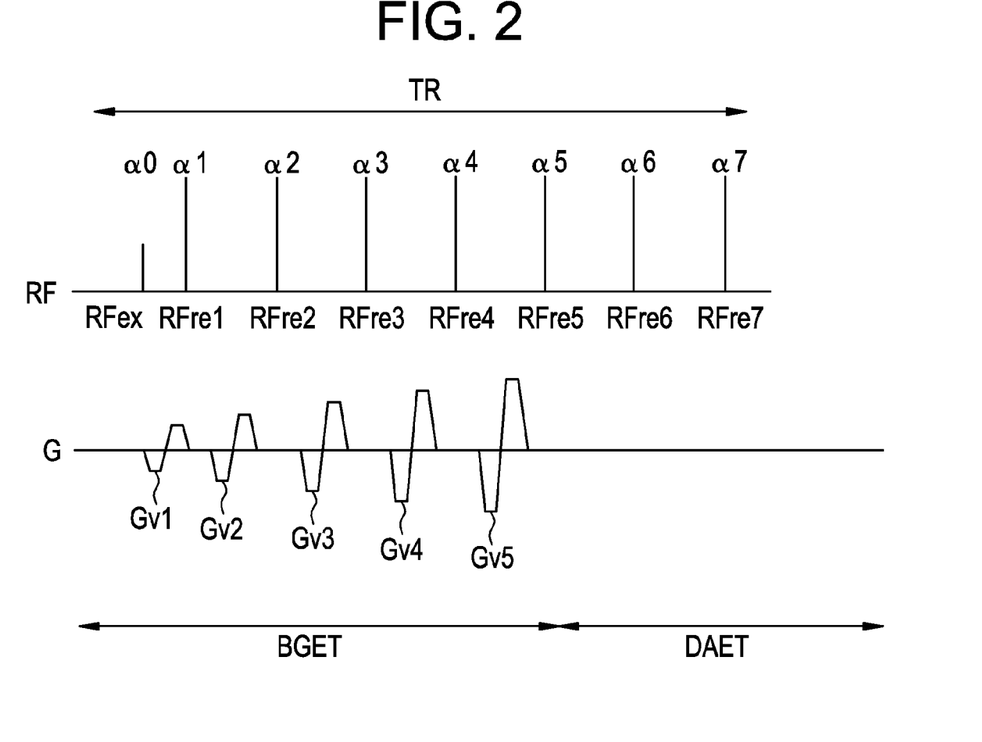
FIG. 2 is a diagram illustrating one pulse sequence executed at the magnetic resonance imaging apparatus according to the embodiment of the present invention.

A pulse sequence at the time that the subject SU is photographed or imaged using the magnetic resonance imaging apparatus 1 shown in FIG. 1 is shown in FIG. 2.

The pulse sequence shown in FIG. 2 shows an example in which the FSE method is executed.

In FIG. 2, RF indicates a time base on which RF pulses are transmitted, and G indicates a time base on which gradient pulses are applied. At the RF and G, the horizontal axis indicates a time t and the vertical axis indicates a pulse intensity, respectively. Here, G is at least one time base as viewed in the slice selection direction, the phase encode direction and the frequency encode direction.

In order to carry out the FSE method, as shown in FIG. 2, an excitation RF pulse RFex of a flip angle $\alpha 0=90°$ is first generated by the RF coil unit 14 driven by the RF driver 22. After the generation of the excitation RF pulse RFex of $\alpha 0=90°$, inversion RF pulses RFre1 through RFre7 of $\alpha 1$ through $\alpha 7=180°$ are similarly generated within one repetition time TR by the RF coil unit 14 driven by the RF driver 22.

After the first excitation RF pulse RFex, the inversion RF pulses RFre1 through RFre7 corresponding to seven times are generated to create magnetic resonance signals corresponding to 7 echoes. Phase encodes independent of one another by their corresponding magnetic resonance signals are performed by the gradient coil unit 13 driven by the gradient driver 23. The magnetic resonance signals at which the phase encodes are respectively performed, are acquired into the data acquisition unit 24.

At the time base of the pulse sequence shown in FIG. 2, however, a predetermined time interval subsequent to the generation of the excitation pulse RFex is allocated as the time at which the gradient coil unit 13 generates each of velocity encode gradient pulses inverted to one another in polarity. This time corresponds to a so-called bipolar gradient echo train (BGET) time at an echo train initial stage. The acquisition of the magnetic resonance signals from the subject SU by the data acquisition unit 24 is not performed within the bipolar gradient echo train (BGET) time.

As shown in the pulse sequence of FIG. 2, the excitation RF pulse RFex is generated and thereafter the velocity encode gradient pulses Gv1 through Gv5 inverted to one another in polarity are applied to the subject SU within the bipolar gradient echo train BGET time by the gradient coil unit 13 driven by the gradient driver 23. The respective velocity encode gradient pulses Gv1 through Gv5 are applied within transmission interval times of the respective RF pulses respectively.

That is, the velocity encode gradient pulse Gv1 is first applied within the transmission interval times of the excitation RF pulse RFex and the inversion RF pulse RFre1. Similarly, other velocity encode gradient pulses Gv2 through Gv5 are applied within the transmission interval times of the respective inversion RF pulses RFre.

The velocity encode gradient pulses Gv corresponding to five pulses in total are generated in the pulse sequence shown in FIG. 2. The velocity encode gradient pulses Gv1 through Gv5 are defined as bipolar pulses which are opposite to one another in polarity on the time base about the central points of time at which the velocity encode gradient pulses Gv1 through Gv5 are applied, and which have the same time integral values.

In FIG. 2, the excitation RF pulse RFex and the inversion RF pulses RFre1 through RFre7 are transmitted to the subject SU. Here, a flowing bloodstream and tissues considered to remain stationary exist in the subject SU. With each stationary tissue as the reference, the phase $\phi$ at the time that the excitation RF pulse RFex and the inversion RF pulses RFre1 through RFre7 are transmitted to the subject SU, is set to $\phi=0°$ with respect to the excitation RF pulse RFex and set to $\phi=90°$ with respect to the inversion RF pulses RFre1 through RFre7, respectively. This is done to prevent that imperfections (displacements or deviations from the rotational angle 180°) of the inversion RF pulses RFre1 through RFre7 are integrated so that the magnetic resonance signals subsequent to the second are reduced.

The condition for setting such a phase corresponds to a CPMG (Carr-Purcell-Meiboom-Gill) condition under which the phases of the inversion RF pulses RFre1 through RFre7 are defined to a predetermined phase shifted by $\pi/2$ with respect to the phase of the excitation RF pulse RFex. Here, a magnetic resonance signal from the stationary tissue satisfies the CPMG condition.

On the other hand, the blood lying in the blood vessel is flowing within the subject SU while its direction is being constantly changed in the case of the flowing bloodstream. Therefore, each magnetic resonance signal for the bloodstream is affected by the velocity encode gradient pulses Gv1 through Gv5 generated by 5 pulses in the pulse sequence shown in FIG. 2.

That is, after the excitation RF pulse RFex and the inversion RF pulses RFre1 through RFre4 are transmitted respectively, the velocity encode gradient pulses Gv1 through Gv5 are respectively applied in the case of the bloodstream. Therefore, the phase of $\phi=\theta0°$ (where $\theta0$: arbitrary angle) is set to the excitation RF pulse RFex, and the phase of $\phi=\theta0+\theta i$ (where i=1 to 5)°($\theta i=i \times \theta a$) is set to the inversion RF pulses RFre1 through RFre4.

As shown in the above relationship, for example, $\theta i$ is changed so as to linearly increase according to the order of generation of the velocity encode gradient pulses Gv1 through Gv5. To this end, the intensities of the velocity encode gradient pulses Gv1 through Gv5 are increased depending upon the order of their generation. With such a change, the transverse magnetization of spins about the blood is dispersed. Therefore, each magnetic resonance signal produced from the bloodstream does not satisfy the CPMG condition, so that the intensity of the magnetic resonance signal from the bloodstream is reduced. With the reduction in the intensity of each magnetic resonance signal from the bloodstream, a flow such as the bloodstream in the subject, which is displayed on the display unit 33, is extracted at low luminance. Since the velocity encode gradient pulses Gv1 through Gv5 are generated plural times in particular, the distribution of the transverse magnetization of the spins about the blood is further enhanced.

After the application of the velocity encode gradient pulses Gv1 through Gv5 has been completed and the bipolar gradient echo train BGET time has elapsed, the RF coil unit 14 receives the magnetic resonance signals from the subject SU therein. And the data acquisition unit 24 acquires the magnetic resonance signals received by the RF coil unit 14. The time at which the data acquisition unit 24 acquires the magnetic resonance signals, is allocated as a data acquisition echo train (DAET) time.

A sequence for allowing the data acquisition unit 24 to acquire the magnetic resonance signals at the data acquisition echo train DAET time will be explained. The present sequence is similar to the sequence that performs the acquisition of the magnetic resonance signals of the normal magnetic resonance imaging apparatus. That is, when the excitation RF pulse is generated, a slice selection gradient magnetic field is applied to the subject SU. When the magnetic resonance signals corresponding to the respective inversion RF pulses are received by the RF coil unit 14, a stepwise-changed phase encode gradient magnetic field is applied to the subject SU and a frequency encode gradient magnetic field is applied to the subject SU.

Since how to apply the slice selection gradient magnetic field, the phase encode gradient magnetic field and the frequency encode gradient magnetic field at the pulse sequence shown in FIG. 2 is similar to the case in which the known FSE method is effected, its schematic representation is omitted.

Here, the reception of the seven magnetic resonance signals respectively obtained by the seven inversion RF pulses RFre1 through RFre7 by the RF coil unit 14 is done within the data acquisition echo train DAET time. When the velocity encode gradient pulses Gv1 through Gv5 are generated where the magnetic resonance signals are being received by the RF coil unit 14, normal spin echo signals cannot be received. Since, however, the velocity encode gradient pulses Gv1 through Gv5 are generated within the bipolar gradient echo train BGET time prior to the data acquisition echo train DAET time, the magnetic resonance signals received by the RF coil unit 14 become the normal spin echo signals. Further, waiting the reception of each magnetic resonance signal until the data acquisition echo train DAET time makes it possible to ensure time enough to disperse the transverse magnetization of the spins about the blood within the bipolar gradient echo train BGET time.

Furthermore, since the velocity encode gradient pulses Gv1 through Gv5 for dispersing the transverse magnetization of the spins about the blood are applied to the subject SU plural times, and the magnetic resonance signals are received by the RF coil unit 14 during the data acquisition echo train DAET time at which the dispersion of the transverse magnetization of the spins about the blood is sufficiently completed, the flow of the blood in the subject SU can be drawn at the image generator 31 at low luminance. Since the FSE method has been executed, high-speed or fast imaging is of course made possible.

Figure 3:
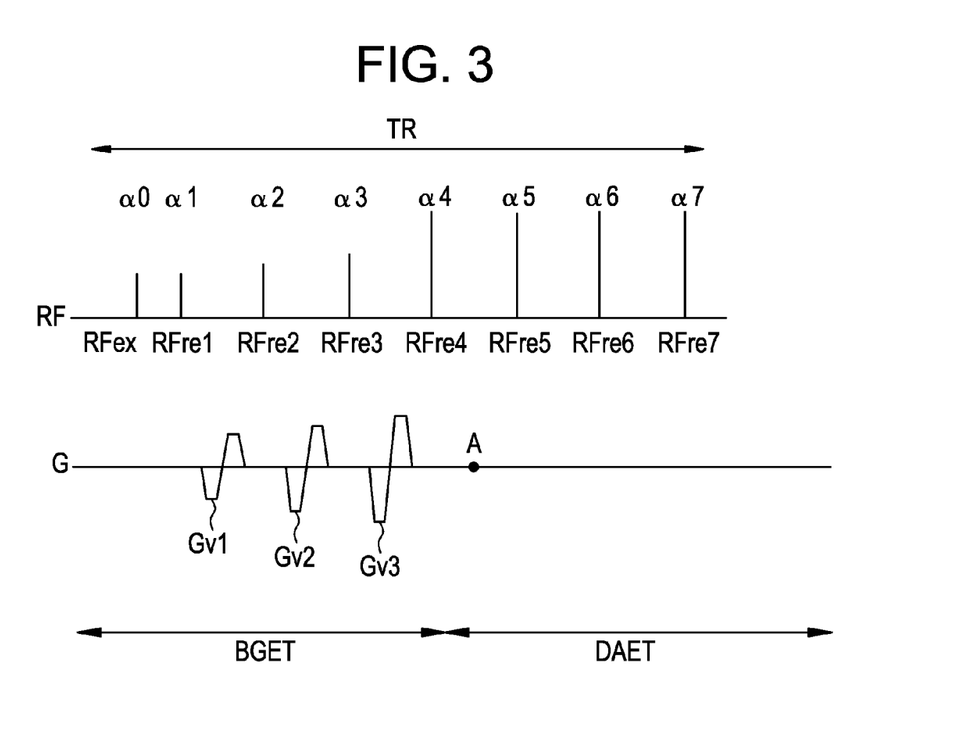
FIG. 3 is a diagram depicting one pulse sequence executed at the magnetic resonance imaging apparatus according to the embodiment of the present invention.

A reference is made to a pulse sequence shown in FIG. 3 in order to further explain the action of the phase encode gradient magnetic field with respect to the pulse sequence shown in FIG. 2.

RF indicates a time base on which RF pulses are transmitted, and G indicates a time base on which gradient pulses are applied. At the respective RF and G, the horizontal axis indicates a time t and the vertical axis indicates a pulse intensity, respectively. Here, G indicates the time base for application of the gradient pulses and is at least one time base as viewed in a slice selection direction, a phase encode direction and a frequency encode direction. Incidentally, since the diagrammatic representation of the slice selection gradient magnetic field, phase encode gradient magnetic field and frequency encode gradient magnetic field in G is of the known method, it is omitted.

In order to execute the FSE method, as shown in FIG. 3, an excitation RF pulse RFex of a flip angle $\alpha 0 = 90°$ is first transmitted by the RF coil unit 14 driven by the RF driver 22. Here, in the pulse sequence shown in FIG. 2, the inversion RF pulses RFre1 through RFre7 of $\alpha 1$ through $\alpha 7 = 180°$ have been applied within one repetition time TR after the transmission of the excitation RF pulse RFex of $\alpha 0 = 90°$. In the pulse sequence shown in FIG. 3, inversion RF pulses RFre1 through RFre3 transmitted within a bipolar gradient echo train BGET time are assumed to be $\alpha 1 = \pi \times (3/6)$, $\alpha 2 = \pi \times (4/6)$ and $\alpha = \pi \times (5/6)$ to increase the intensity of each excitation echo. This case is different from the pulse sequence of FIG. 2 and is not a complete CPMG method. Inversion RF pulses RFre4 through RFre7 transmitted within a data acquisition echo train DAET time are assumed to be $\alpha 4$ through $\alpha 7 = \pi \times 2$.

Thus, after the first excitation RF pulse RFex, the inversion RF pulses RFre1 through RFre7 corresponding to seven times are transmitted to create magnetic resonance signals corresponding to 7 echoes. Phase encodes independent of one another by their corresponding magnetic resonance signals are performed by the gradient coil unit 13 driven by the gradient driver 23. The magnetic resonance signals at which the phase encodes are respectively performed, are acquired into the data acquisition unit 24.

As shown in the pulse sequence of FIG. 3, the excitation RF pulse RFex is transmitted and thereafter velocity encode gradient pulses Gv1 through Gv3 inverted to one another in polarity are applied to the subject SU within the bipolar gradient echo train BGET time by the gradient coil unit 13 driven by the gradient driver 23. Further, in a manner similar to the pulse sequence shown in FIG. 2, the respective velocity encode gradient pulses Gv1 through Gv3 are applied within transmission interval times of the respective RF pulses respectively.

In FIG. 3, the excitation RF pulse RFex and the inversion RF pulses RFre1 through RFre7 are transmitted to the subject SU. With each stationary tissue as the reference, the phase $\phi$ at the time that the excitation RF pulse RFex and the inversion RF pulses RFre1 through RFre7 are transmitted to the subject SU, is set to $\phi = 0°$ with respect to the excitation RF pulse RFex and set to $\phi = 90°$ with respect to the inversion RF pulses RFre1 through RFre7, respectively. That is, magnetic resonance signals of the stationary tissues are not affected by the velocity encode gradient pulses Gv1 through Gv3.

On the other hand, the blood lying in the blood vessel is flowing within the subject SU while its direction is being constantly changed in the case of the flowing bloodstream. Therefore, each magnetic resonance signal for the bloodstream is affected by the velocity encode gradient pulses Gv1 through Gv3 applied by 3 pulses in the pulse sequence shown in FIG. 3.

That is, after the excitation RF pulse RFex and the inversion RF pulses RFre1 through RFre3 are transmitted respectively, the velocity encode gradient pulses Gv1 through Gv3 are respectively applied in the case of the bloodstream. Therefore, the phase of $\phi = 0°$ is set to the excitation RF pulse RFex, and the phase of $\phi = \pi/2 + \theta i$ (where i=1 to 3)°($\theta i = i \times \theta a$) is set to the inversion RF pulses RFre1 through RFre3. Since the magnitude of $\phi$ about the bloodstream changes in this way, the transverse magnetization of spins about the blood is dispersed.

Figure 4A:
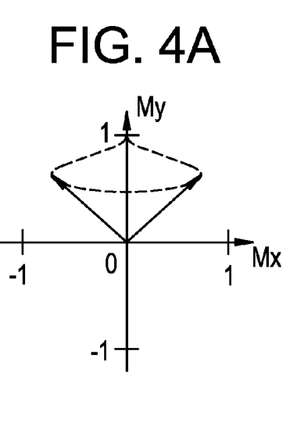
FIGS. 4(a), 4(b), and 4(c) are diagrams showing transverse distributions of magnetic resonance signals obtained in the pulse sequence shown in FIG. 3.
Figure 4B:
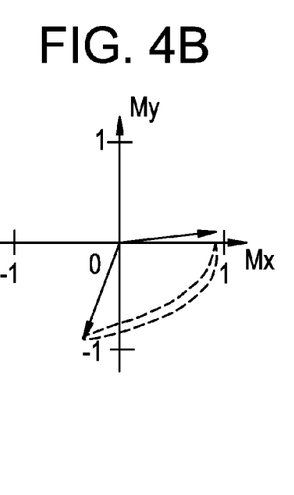
Figure 4C:
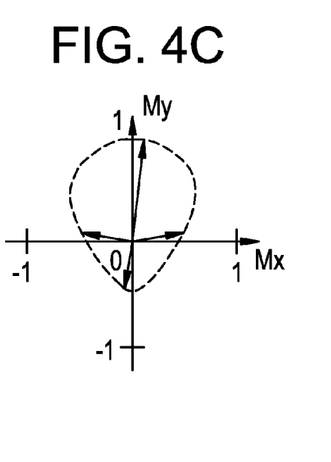

Reference is made to FIG. 4 to explain the dispersion of transverse magnetization of the spins of the magnetic resonance signal of each stationary tissue and the magnetic resonance signal of the bloodstream. FIG. 4 illustrates by way of example, distributions of magnetization Mx and My as viewed in the transverse directions (x and y directions), of a magnetic resonance signal obtained at a point A of the data acquisition echo train DAET time in the pulse sequence of FIG. 3, i.e., transversely magnetized distributions. In FIG. 4, the distribution of transverse magnetization is shown by dotted lines, and the arrows indicate transversely magnetized vectors.

FIG. 4(*a*) shows the distribution of transverse magnetization of the magnetic resonance signal about the stationary tissue. This distribution results in one shaped in the form of an ellipse with My=0.76 as the center. That is, when the angle is measured with an Mx axis as the point of origin, transverse magnetization is distributed at a position with 90° as the center.

Next consider the distribution of transverse magnetization about the bloodstream. FIG. 4(*b*) shows the distribution of transverse magnetization at the time of $\theta 1 = \pi$ in the above $\phi = \pi/2 + \theta i$ (where i=1). FIG. 4(*c*) shows the distribution of transverse magnetization at the time of $\theta 1 = 2\pi$.

In FIG. 4(*b*), the transverse magnetization is distributed in the form of a half moon. In FIG. 4(*c*), the transverse magnetization is distributed in the form of a drop with My=0.20 as the center. In the case of FIG. 4(*c*) in particular, the transverse magnetization is distributed in all directions of Mx and My and the phase thereof is distributed over 360°.

Figure 5A:
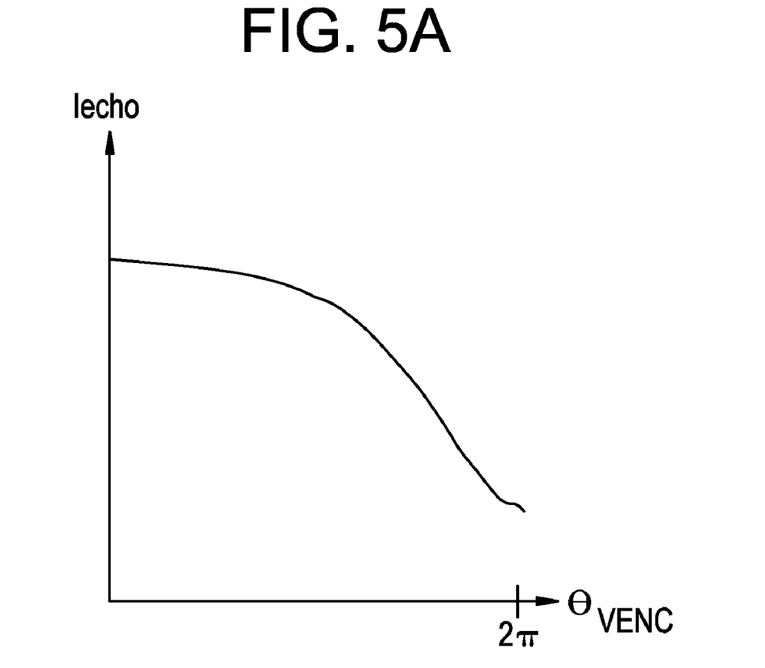
FIGS. 5(a) and 5(b) are diagrams illustrating (a) the phase of a subject's tissue affected by an RF pulse and the intensity of an acquired magnetic resonance signal, and (b) the phase of the subject's tissue and the phase of the magnetic resonance signal.
Figure 5B:
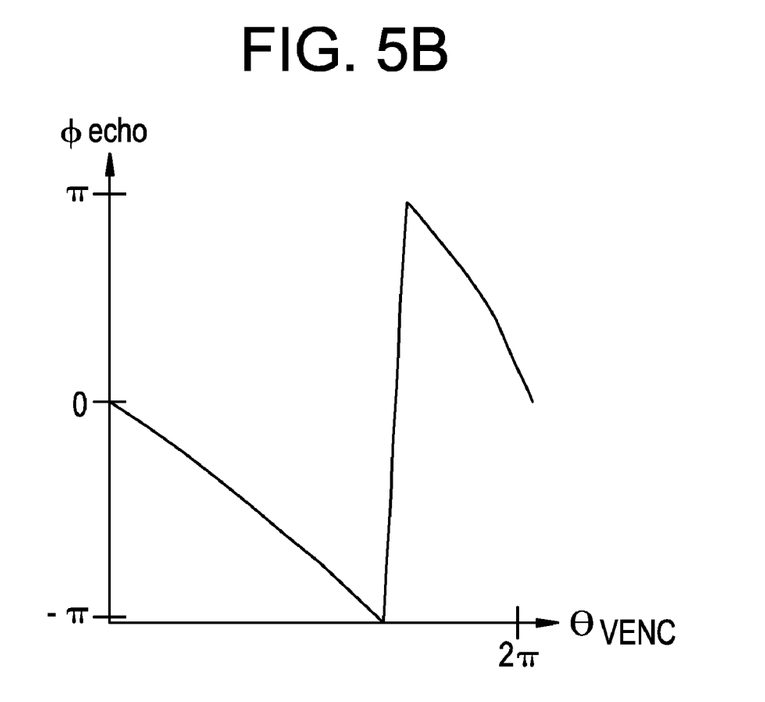

FIG. 5(*a*) shows the relationship between the phase $\theta$VENC of a subject's tissue set at the pulse sequence shown in FIG. 3 and the intensity (Iecho) of a magnetic resonance signal acquired at the point A of the data acquisition echo train DAET time. FIG. 5(*b*) shows the relationship between $\theta$VENC and the phase ($\phi$echo) of the magnetic resonance signal.

It is understood in FIG. 5(*a*) that when $\theta$VENC (for example, $\theta$VENC=$\theta 1$)=$2\pi$, the intensity (Iecho) of the magnetic resonance signal is suddenly reduced. That is, as shown in FIG. 4(c), the magnetic resonance signal from the bloodstream becomes small with the distribution of the phase of the transverse magnetization of the spins about the blood over 360°.

Figure 6:
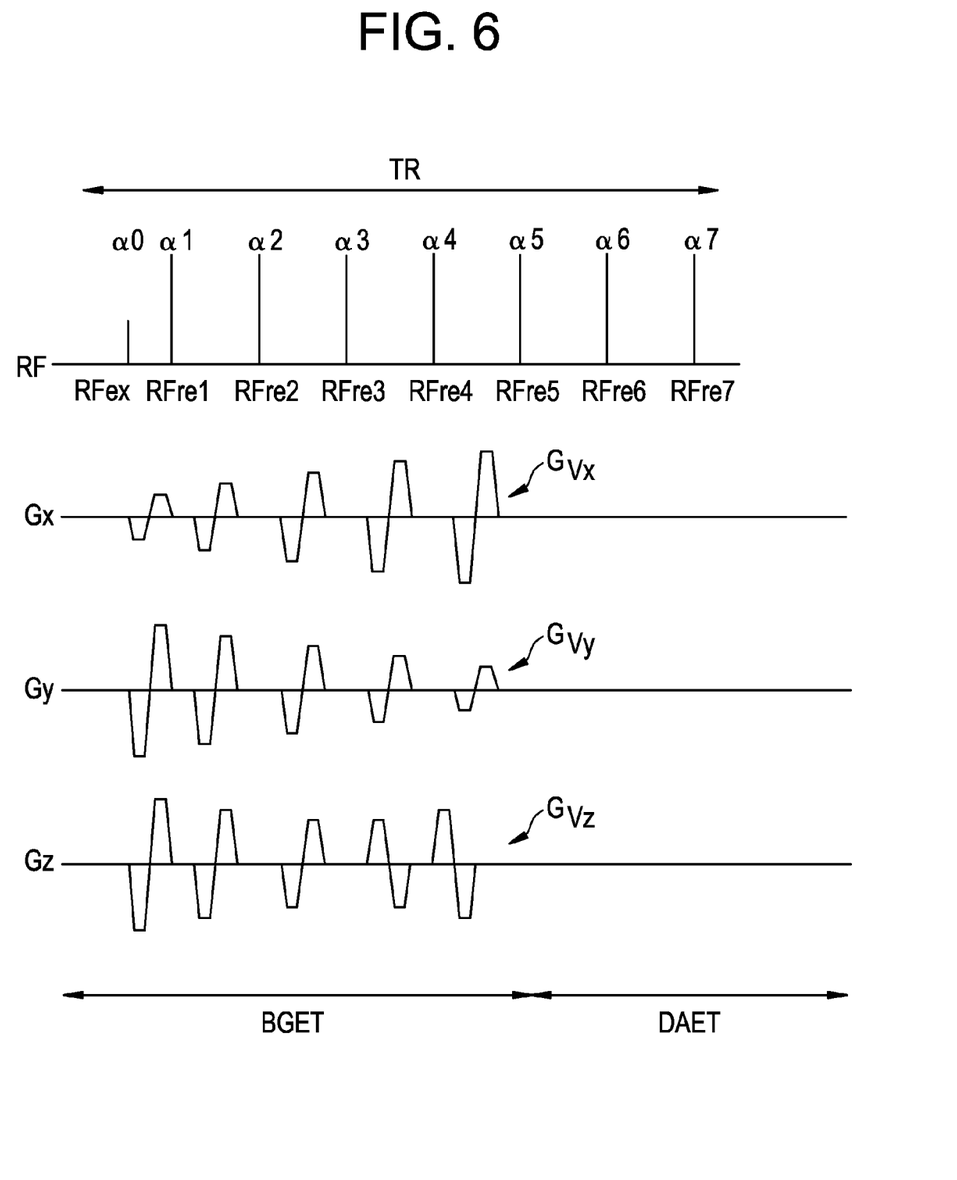
FIG. 6 is a diagram showing another pulse sequence executed at the magnetic resonance imaging apparatus according to the embodiment of the present invention.

FIG. 6 shows another pulse sequence where the subject SU is photographed or imaged using the magnetic resonance imaging apparatus 1 shown in FIG. 1.

In FIG. 6, the pulse sequence is different from the pulse sequence shown in FIG. 2 in that the time base G for application of each gradient pulse is shown as one axis in FIG. 2, whereas in FIG. 6, the number of time bases for transmission of the gradient pulses is represented as three axes of Gx, Gy and Gz. In FIG. 6, for example, the time base of Gx corresponds to a time base as viewed in a frequency encode direction, Gy corresponds to a time base as viewed in a phase encode direction, and Gz corresponds to a time base as viewed in a slice selection direction, respectively.

In the pulse sequence shown in FIG. 6, velocity encode gradient pulses Gvx, Gvy and Gvz used plural times, which are inverted to one another in polarity, are applied to the subject SU over all the three axes of Gx, Gy and Gz within a bipolar gradient echo train BGET time. The application of the velocity encode gradient pulses Gvx, Gvy and Gvz is performed by the gradient coil unit 13 driven by the gradient driver 23.

Further, the respective velocity encode gradient pulses Gvx, Gvy and Gvz are applied within transmission intervals times of RF pulses (excitation RF pulse RFex and inversion RF pulses RFre1 through RFre5) shown in FIG. 6.

In the pulse sequence shown in FIG. 2, the velocity encode gradient pulses G have increased in amplitude according to the order of their application. On the other hand, in the pulse sequence shown in FIG. 6, there are included in the multiple velocity encode gradient pulses Gvx, Gvy and Gvz, those which increase in amplitude according to the order of their application, those which decrease in amplitude according to the order thereof and those which change in amplitude at random.

Incidentally, the inversion RF pulses RFre1 through RFre7 corresponding to seven times are transmitted after the first excitation RF pulse RFex transmitted within one repetition time TR to create seven magnetic resonance signals even at the pulse sequence shown in FIG. 6 in a manner similar to the pulse sequence illustrated in FIG. 2, thereby making it possible to execute the FSE method. With each stationary tissue as the reference, the phase φ at the time that the excitation RF pulse RFex and the inversion RF pulses RFre1 through RFre7 are transmitted to the subject SU, is set to φ=0° with respect to the excitation RF pulse RFex and set to φ=90° with respect to the inversion RF pulses RFre1 through RFre7, respectively.

After the application of the multiple velocity encode gradient pulses Gvx, Gvy and Gvz has been completed and the bipolar gradient echo train BGET time has elapsed, the RF coil unit 14 receives the magnetic resonance signals from the subject SU therein. And the data acquisition unit 24 acquires the magnetic resonance signals received by the RF coil unit 14. The time at which the data acquisition unit 24 acquires the magnetic resonance signals, is allocated as a data acquisition echo train DAET time.

The data acquisition unit 24 performs acquisition of the magnetic resonance signals during the data acquisition echo train DAET time. The acquisition of the magnetic resonance signals is similar to the sequence of acquiring the magnetic resonance signals by the normal magnetic resonance imaging apparatus even at the pulse sequence shown in FIG. 6. That is, when the excitation RF pulse is transmitted, a slice selection gradient magnetic field is applied to the subject SU on the axis of Gz. When the magnetic resonance signals corresponding to the respective inversion RF pulses are received by the RF coil unit 14, a stepwise-changed phase encode gradient magnetic field is applied to the subject SU on the axis of Gy, and a frequency encode gradient magnetic field is applied to the subject SU on the axis of Gx.

Incidentally, since how to apply the slice selection gradient magnetic field, the phase encode gradient magnetic field and the frequency encode gradient magnetic field at the pulse sequence shown in FIG. 6 is similar to the case in which the known FSE method is carried out, its schematic representation is omitted.

The reception of the seven magnetic resonance signals respectively obtained by transmitting the seven inversion RF pulses RFre1 through RFre7 by the RF coil unit 14 is performed within the data acquisition echo train DAET time even at the pulse sequence of FIG. 6 in a manner similar to the pulse sequence of FIG. 2. Therefore, there is no need to consider the velocity encode gradient with respect to the magnetic resonance signals received by the RF coil unit 14.

Further, the velocity encode gradient pulses Gv are applied only in the one-axis direction in the pulse sequence of FIG. 2, whereas the velocity encode gradient pulses are applied in the three-axis directions of Gvx, Gvy and Gvz in the pulse sequence of FIG. 6. Therefore, the transverse magnetization of the spins about the bloodstream can be dispersed in all directions within the subject SU, so that each magnetic resonance signal from the bloodstream is reduced. Therefore, the flow of the blood in the subject SU can be drawn at the image generator 13 at lower luminance. Incidentally, since the areas of the multiple velocity encode gradient pulses Gvx, Gvy and Gvz are respectively changed in the time-base direction at random, it is much easier to perform the dispersion of the transverse magnetization of the spins of the bloodstream.

Figure 7:
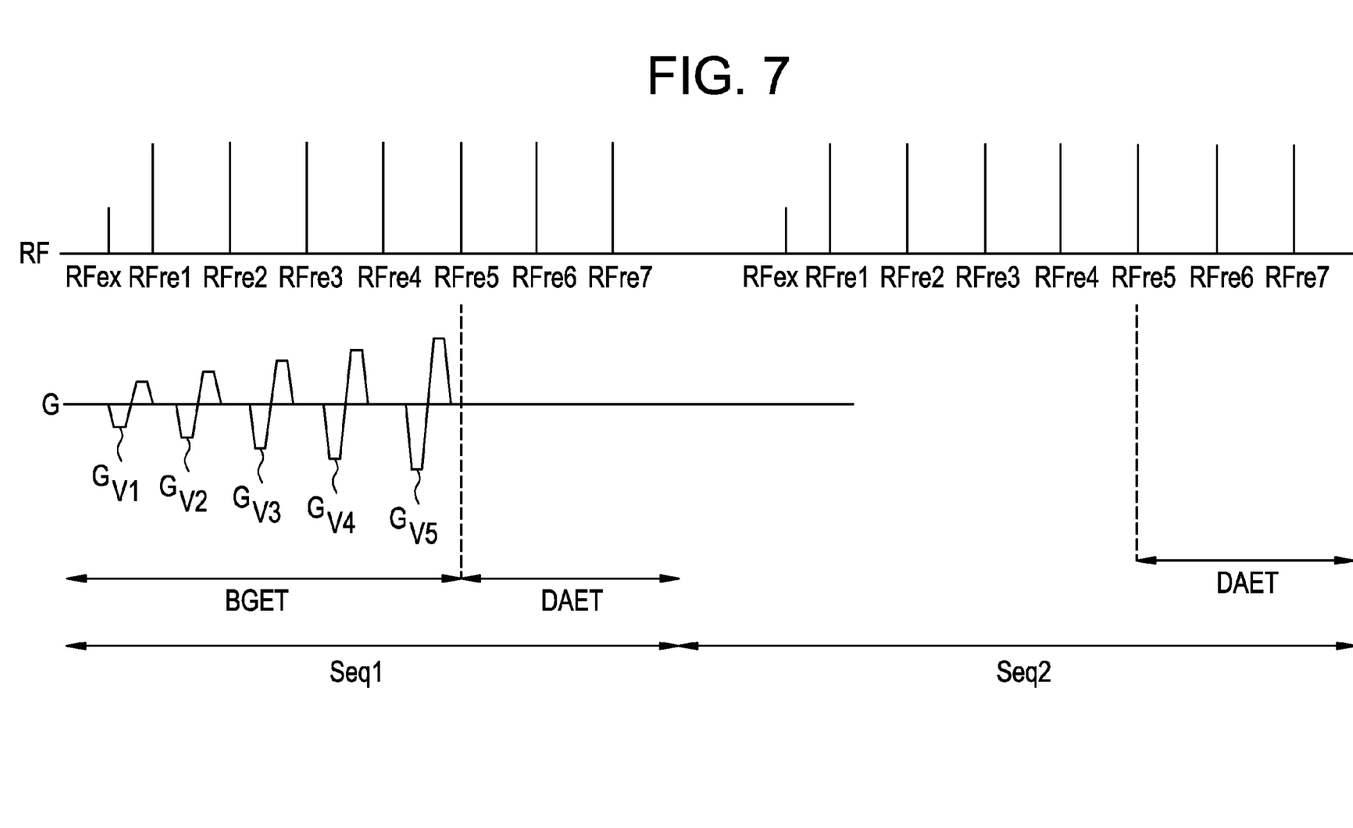
FIG. 7 is a diagram illustrating a further sequence executed at the magnetic resonance imaging apparatus according to the embodiment of the present invention.

FIG. 7 shows a further pulse sequence where a subject SU is imaged or photographed using the magnetic resonance imaging apparatus 1 shown in FIG. 1.

The pulse sequence shown in FIG. 7 is different from the pulse sequence shown in FIG. 2 in that a sequence 2 (seq2) for not applying velocity encode gradient pulses Gv1 through Gv5 comprising bipolar pulses corresponding to five pulses to the subject SU is added to a sequence 1 (seq1) for applying the velocity encode gradient pulses Gv1 through Gv5 to the subject SU within a bipolar gradient echo train BGET time at G indicative of a time base on which gradient pulses are applied. Incidentally, the velocity encode gradient pulses Gv1 through Gv5 are applied within transmission interval times of RF pulses.

At both the sequences 1 and 2, an excitation RF pulse RFex and seven inversion RF pulses RFre1 through RFre7 are transmitted to the subject SU to enable execution of the FSE method. The data acquisition unit 24 acquires magnetic resonance signals during data acquisition echo train DAET times of the sequences 1 and 2.

The magnetic resonance signals acquired by the data acquisition unit 24 at the sequence 1 include the magnetic resonance signals in which transverse magnetization of spins about the blood is dispersed to the subject SU, whereas the magnetic resonance signals acquired by the data acquisition unit 24 at the sequence 2 do not include the magnetic resonance signals in which the transverse magnetization of the spins about the blood is dispersed.

Therefore, when the image generator 31 reconstructs an image about the subject SU based on the corresponding magnetic resonance signal, the magnetic resonance signals that do not include the magnetic resonance signals in which the transverse magnetization of the spins about the blood is dispersed, are subtracted from the magnetic resonance signals including the magnetic resonance signals in which the transverse magnetization of the spins about the blood is dispersed, thereby making it possible to reconstruct the image.

Since the flow of the blood is fast where, for example, the blood flows through the arteries, the dispersion of transverse magnetization of spins about the blood in the arteries becomes large in particular by application of the velocity encode gradient pulses Gv1 through Gv5 comprising the bipolar pulses to the blood in the arteries. Therefore, only an image about the artery is displayed in the image reconstructed by performing substruction of the magnetic resonance signals between the sequence 1 and the sequence 2.

Further, the sequence 1 and the sequence 2 can be timed in such a manner that the sequence 1 is performed during an expansion/contraction phase in a cardiac cycle, and the sequence 2 is performed during an expansion or diastolic phase in the cardiac cycle. Since the flow of the blood flowing through the artery is fast during the expansion/contraction phase, the sequence 1 for applying the velocity encode gradient pulses Gv1 through Gv5 is executed during the expansion/contraction phase, thereby making it possible to further enlarge the dispersion of transverse magnetization of the spins about the artery' blood. Therefore, only the artery image can be displayed more distinctly in the image reconstructed by performing subtraction of the magnetic resonance signals between the sequence 1 and the sequence 2. Incidentally, in order to make synchronization with the cardiac cycle for image reconstruction, a pulse rate meter may be provided in the magnetic resonance imaging apparatus to measure a heart rate of the subject SU.

Although the velocity encode gradient pulses inverted to one another in polarity have been applied within the bipolar gradient echo train BGET time at the pulse sequences shown in FIGS. 2, 3 and 6, the amplitude and cycle of each of the velocity encode gradient pulses can be set arbitrarily. Thus, since the areas of the velocity encode gradient pulses can be changed, the degree of dispersion of transverse magnetization of the magnetic resonance signals about the bloodstream can be adjusted. The setting of the amplitude and cycle of each velocity encode gradient pulse can be performed by operating the operation unit 32 to input operation data.

Since the above setting can be made to the velocity encode gradient pulses, the dispersion of transverse magnetization of the spins about the flow in the subject can be made quantitative. Therefore, the preparation scan, which is carried out prior to the actual scan to adjust the gradient of each spoiling pulse in the prior art, becomes unnecessary.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus comprising:
a static magnetic field forming unit which forms a static magnetic field in a space in which a subject is held;
a transmission unit which transmits a plurality of inversion RF pulses to the subject lying in the static magnetic field plural times within one repetition time after transmission of one excitation RF pulse thereby to excite spins of the subject;
a gradient magnetic field application unit which applies a gradient magnetic field to the subject and encodes magnetic resonance signals from the spins excited by the inversion RF pulses;
a data acquisition unit which acquires the magnetic resonance signals encoded by the gradient magnetic field; and
an image generation unit which generates an image of the subject, based on the magnetic resonance signals acquired by the data acquisition unit,
wherein the gradient magnetic field application unit applies velocity encode gradient pulses inverted to one another in polarity to the subject within transmission interval times of the RF pulses transmitted to the subject.

2. The magnetic resonance imaging apparatus according to claim 1, wherein the gradient magnetic field application unit applies the velocity encode gradient pulses before the data acquisition unit acquires the magnetic resonance signals.

3. The magnetic resonance imaging apparatus according to claim 1, wherein the gradient magnetic field application unit applies the velocity encode gradient pulses to the subject plural times with respect to the plurality of inversion RF pulses.

4. The magnetic resonance imaging apparatus according to claim 2, wherein the gradient magnetic field application unit applies the velocity encode gradient pulses to the subject plural times with respect to the plurality of inversion RF pulses.

5. The magnetic resonance imaging apparatus according to claim 2, wherein the velocity encode gradient pulses inverted to one another in polarity spoil transverse magnetization of spins about a flow in the subject.

6. The magnetic resonance imaging apparatus according to claim 3, wherein the velocity encode gradient pulses inverted to one another in polarity spoil transverse magnetization of spins about a flow in the subject.

7. The magnetic resonance imaging apparatus according to claim 4, wherein the velocity encode gradient pulses inverted to one another in polarity spoil transverse magnetization of spins about a flow in the subject.

8. The magnetic resonance imaging apparatus according to claim 5, wherein the flow in the subject is a bloodstream.

9. The magnetic resonance imaging apparatus according to claim 1, wherein the directions of the velocity encode gradient pulses inverted to one another in polarity are defined as directions of at least one or more axes.

10. The magnetic resonance imaging apparatus according to claim 9, wherein the areas of the velocity encode gradient pulses inverted to one another in polarity differ every axis.

11. The magnetic resonance imaging apparatus according to claim 1, further including an operation unit for inputting the areas of the velocity encode gradient pulses applied to the subject by the gradient magnetic field application unit.

12. The magnetic resonance imaging apparatus according to claim 1, wherein the image generation unit generates an image of the subject, based on the magnetic resonance signals acquired by the data acquisition unit in states in which the gradient magnetic field application unit applies the velocity encode gradient pulses inverted to one another in polarity to the subject and do not apply the same thereto.

13. The magnetic resonance imaging apparatus according to claim 12, wherein the gradient magnetic field application unit generates states of application and unapplication of the velocity encode gradient pulses inverted to one another in polarity according to pulsatility of the bloodstream.

14. A magnetic resonance imaging method comprising the steps of:
transmitting a plurality of inversion RF pulses plural times to a subject lying in a static magnetic field within one repetition time after transmission of one excitation RF pulse;

applying a gradient magnetic field to the subject and encoding magnetic resonance signals from spins excited by the RF pulses;

acquiring the magnetic resonance signals each encoded by the gradient magnetic field; and generating an image of the subject based on the acquired magnetic resonance signals, the method further including the step of:

applying velocity encode gradient pulses inverted to one another in polarity to the subject within transmission interval times for the RF pulses transmitted to the subject.

15. The magnetic resonance imaging method according to claim 14, wherein the step of applying the velocity encode gradient pulses inverted to one another in polarity to the subject is performed before the step of acquiring the magnetic resonance signals.

16. The magnetic resonance imaging method according to claim 14, where in the step of applying the velocity encode gradient pulses inverted to one another in polarity to the subject, transverse magnetization of spins about a flow in the subject is spoiled.

17. The magnetic resonance imaging method according to claim 14, wherein in the step of applying the velocity encode gradient pulses inverted to one another in polarity to the subject, the directions of the velocity encode gradient pulses inverted to one another in polarity are defined as directions of at least one or more axes.

18. The magnetic resonance imaging method according to claim 17, wherein the areas of the velocity encode gradient pulses inverted to one another in polarity differ every axis.

19. The magnetic resonance imaging method according to claim 14, wherein in the step of applying the velocity encode gradient pulses inverted to one another in polarity to the subject, the area of the gradient magnetic field is adjusted according to the speed of the flow in the subject.

20. The magnetic resonance imaging method according to claim 14, further including a step of not applying the velocity encode gradient pulses inverted to one another in polarity to the subject before the step of acquiring the magnetic resonance signals, wherein in the subject' image generating step, an image of the subject is generated based on the magnetic resonance signals acquired in the magnetic resonance signal acquiring step after the step of applying the velocity encode gradient pulses inverted to one another in polarity to the subject and the step of not applying the velocity encode gradient pulses to the subject.

* * * * *